(12) United States Patent
Hatasa et al.

(10) Patent No.: US 10,847,448 B2
(45) Date of Patent: Nov. 24, 2020

(54) SEMICONDUCTOR DEVICE AND METHOD OF MANUFACTURING THE SAME

(71) Applicant: DENSO CORPORATION, Kariya, Aichi-Pref (JP)

(72) Inventors: Keita Hatasa, Toyota (JP); Hiroyuki Takeda, Toyota (JP); Satoshi Takahagi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/247,998

(22) Filed: Jan. 15, 2019

(65) Prior Publication Data

US 2019/0229040 A1 Jul. 25, 2019

(30) Foreign Application Priority Data

Jan. 24, 2018 (JP) .................. 2018-009950

(51) Int. Cl.
*H01L 23/492* (2006.01)
*H01L 23/42* (2006.01)
(Continued)

(52) U.S. Cl.
CPC ............ *H01L 23/492* (2013.01); *H01L 23/42* (2013.01); *H01L 23/49541* (2013.01); *H01L 23/49548* (2013.01); *H01L 23/49562* (2013.01); *H01L 23/49568* (2013.01); *H01L 24/32* (2013.01); *H01L 24/33* (2013.01); *H01L 24/83* (2013.01); *H01L 24/48* (2013.01); *H01L 24/73* (2013.01); *H01L 24/92* (2013.01); *H01L 2224/05624* (2013.01); *H01L 2224/26175* (2013.01); *H01L 2224/29101* (2013.01); *H01L 2224/32245* (2013.01); *H01L 2224/33181* (2013.01); *H01L 2224/48091* (2013.01); *H01L 2224/48247* (2013.01); *H01L 2224/73265* (2013.01); *H01L 2224/83101* (2013.01); *H01L 2224/83385* (2013.01); *H01L 2224/83447* (2013.01); *H01L 2224/83801* (2013.01); *H01L 2224/92247* (2013.01); *H01L 2924/00014* (2013.01);
(Continued)

(58) Field of Classification Search
CPC ... H01L 23/4334; H01L 23/492; H01L 24/32; H01L 24/33
See application file for complete search history.

(56) References Cited

U.S. PATENT DOCUMENTS

2005/0077617 A1* 4/2005 Hirano .................. H01L 23/492
257/712
2005/0093131 A1* 5/2005 Nakase .................. H01L 24/33
257/693
(Continued)

FOREIGN PATENT DOCUMENTS

JP 2005-136018 A 5/2005

*Primary Examiner* — Zander V Smith
*Assistant Examiner* — John M Parker
(74) *Attorney, Agent, or Firm* — Oliff PLC

(57) ABSTRACT

A semiconductor device includes a semiconductor element, a first conductor bonded to an upper surface of the semiconductor element via a first solder layer, and a second conductor bonded to an upper surface of the first conductor via a second solder layer. The first conductor includes at least one groove formed in a stacking direction of the semiconductor element, the first conductor, and the second conductor on a side surface adjacent to the upper surface of the first conductor.

8 Claims, 8 Drawing Sheets

(51) Int. Cl.
*H01L 23/00* (2006.01)
*H01L 23/495* (2006.01)
(52) U.S. Cl.
CPC ............... *H01L 2924/1033* (2013.01); *H01L 2924/10253* (2013.01); *H01L 2924/10272* (2013.01); *H01L 2924/13055* (2013.01); *H01L 2924/13091* (2013.01)

(56) References Cited

U.S. PATENT DOCUMENTS

| | | | | |
|---|---|---|---|---|
| 2005/0167802 A1* | 8/2005 | Hirano | ............... | H01L 24/32 |
| | | | | 257/678 |
| 2006/0108700 A1* | 5/2006 | Nakazawa | ............... | H01L 24/33 |
| | | | | 257/787 |
| 2014/0159216 A1* | 6/2014 | Ishino | ............... | H01L 23/49575 |
| | | | | 257/675 |
| 2014/0327144 A1* | 11/2014 | Yang | ............... | H01L 23/50 |
| | | | | 257/762 |

* cited by examiner

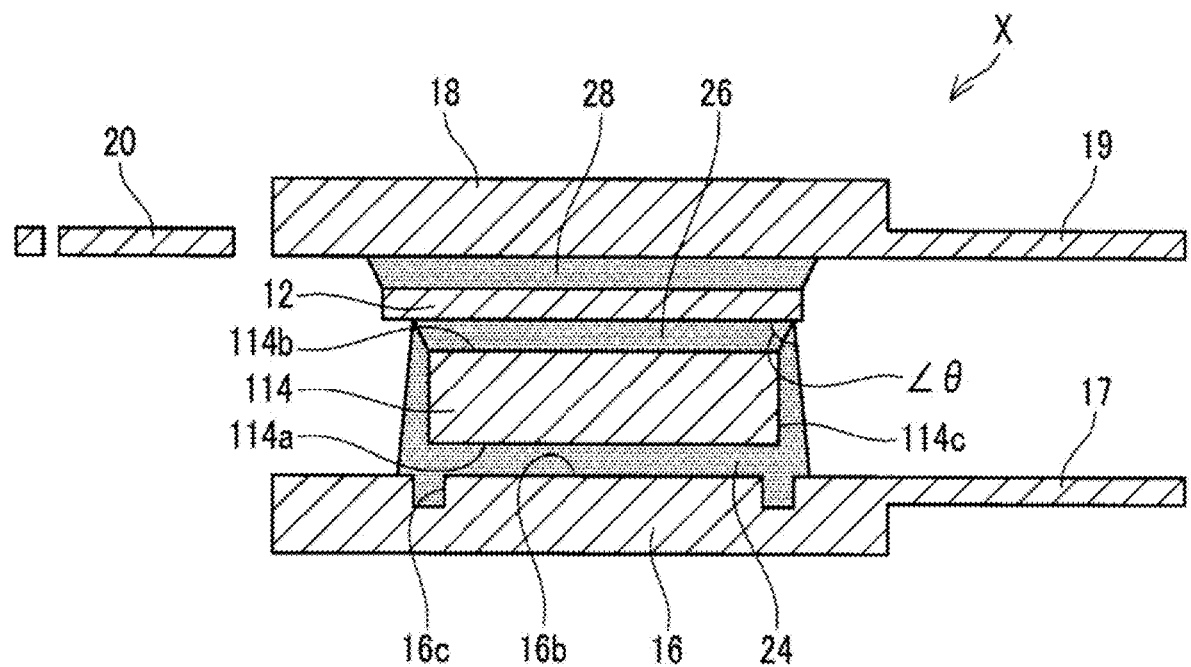

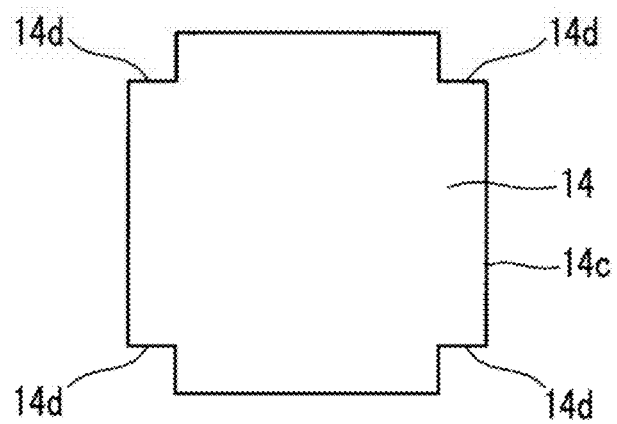

SEMICONDUCTOR DEVICE AND METHOD OF MANUFACTURING THE SAME

INCORPORATION BY REFERENCE

The disclosure of Japanese Patent Application No. 2018-009950 filed on Jan. 24, 2018 including the specification, drawings and abstract is incorporated herein by reference in its entirety.

BACKGROUND

1. Technical Field

The present disclosure relates to a semiconductor device and a method of manufacturing the same.

2. Description of Related Art

Japanese Unexamined Patent Application Publication No. 2005-136018 (JP 2005-136018 A) discloses a semiconductor device. The semiconductor device includes a semiconductor element, a first conductor bonded to an upper surface of the semiconductor element via a solder layer, and a second conductor bonded to an upper surface of the first conductor via a solder layer. In the semiconductor device, a groove surrounding the solder layer is formed on a lower surface of the second conductor, and excessive solder is accommodated inside the groove. With such a configuration, when the first conductor and the second conductor are soldered therebetween, spreading of excessive solder to an unintended range in a wet manner is suppressed.

SUMMARY

In the semiconductor device described above, when the excessive solder cannot be sufficiently absorbed by the groove of the second conductor, the excessive solder spreads in a wet manner along a side surface of the first conductor, and the solder is likely to be connected from the upper surface to the lower surface via the side surface of the first conductor. In this case, it is easy for a large stress to act on the semiconductor element from the solder at a portion at which the solder has been connected. As a result, reliability of the semiconductor device may be degraded. The present disclosure provides a semiconductor device capable of avoiding or reducing degradation of reliability of a semiconductor device caused by excessive solder and a method of manufacturing the semiconductor device.

A first aspect of the present disclosure relates to a semiconductor device. The semiconductor device includes a semiconductor element, a first conductor bonded to an upper surface of the semiconductor element via a first solder layer, and a second conductor bonded to an upper surface of the first conductor via a second solder layer. The first conductor includes at least one groove provided in a stacking direction of the semiconductor element, the first conductor, and the second conductor on a side surface adjacent to the upper surface of the first conductor.

In the semiconductor device described above, the at least one groove extending in the stacking direction of the semiconductor element, the first conductor, and the second conductor on the side surface adjacent to the upper surface of the first conductor is provided. According to the first aspect, when the first conductor and the second conductor are soldered or when the first conductor and the semiconductor element are soldered, excessive solder is guided to the grooves formed on the side surfaces of the first conductor. That is, a position at which the excessive solder spreads in a wet manner can be limited to a position at which the groove is formed. Therefore, in one example, the position of the groove formed on the side surface of the first conductor may be set to a range in which a stress acting on the semiconductor element from the solder is inherently small. Accordingly, even when the solder is connected from the upper surface to the lower surface through the side surface of the first conductor, it is possible to avoid an excessive stress acting on the semiconductor element from the solder. Accordingly, it is possible to avoid or reduce degradation of reliability of the semiconductor device.

In the semiconductor device according to the first aspect, the at least one groove of the first conductor may extend to at least one of the upper surface and the lower surface of the first conductor. In this case, since a solder directly contacts the end portion of the groove when soldering is performed on at least one of the upper surface or the lower surface of the first conductor, it is easy for excessive solder to be guided to the groove formed on the side surface of the first conductor.

In the semiconductor device according to the aspect, the at least one groove of the first conductor may extend to one of the upper surface and the lower surface of the first conductor, and may not extend to the other of the upper surface and the lower surface of the first conductor. That is, a first end portion of the groove may be located on one of the upper surface and the lower surface of the first conductor, and a second end portion of the groove may be separated from the other of the upper surface and the lower surface of the first conductor. In this case, since the first end portion of the groove directly contacts the solder on one of the upper surface and the lower surface of the first conductor, it is easy for excessive solder to be guided to the groove formed on the side surface of the first conductor. On the other hand, since the second end portion of the groove is separated from the other of the upper surface and the lower surface of the first conductor, the solder spreading in a wet manner along the groove reaching the other of the upper surface and the lower surface of the first conductor is suppressed. Accordingly, connection of the solder between the first conductor and the second conductor and the solder between the first conductor and the semiconductor element along the side surface of the first conductor is suppressed.

In the semiconductor device according to the first aspect, the first conductor may include the at least one groove in a range corresponding to a corner portion of the semiconductor element on the side surface of the first conductor. With the above configuration, it is easy for excessive solder to be guided to a range corresponding to a corner portion of the semiconductor element (a range including a position closest to the corner portion of the semiconductor element). Here, at the corner portion of the semiconductor element, a stress acting on the semiconductor element from the solder is inherently small. Therefore, even when the solder is connected from the upper surface to the lower surface through the side surface of the first conductor, it is possible to avoid an excessive stress acting on the semiconductor element from the solder.

In the semiconductor device according to the aspect, the first conductor may include the at least one groove in at least one corner portion among four corner portions of the side surface.

In the semiconductor device according to the aspect, the corner portion may be chamfered.

In the semiconductor device according to the aspect, the corner portion may be cut or pressed to have a cross shape when the first conductor is viewed in a plan view.

In the semiconductor device according to the first aspect, the first conductor may include a plurality of grooves. Accordingly, as the number of grooves formed in the first conductor becomes larger, a larger amount of excessive solder can be guided to and accommodated in the groove, and an effect of an application of the present disclosure can be further enhanced.

In the semiconductor device according to the first aspect, an angle formed by a fillet shape of a solder located between the first conductor and the semiconductor element may be smaller than 90°.

A second aspect of the present disclosure relates to a method of manufacturing a semiconductor device. The method includes solder-bonding a first conductor to an upper surface of a semiconductor element to form a laminate, and solder-bonding a second conductor to an upper surface of the first conductor in the laminate. The first conductor includes at least one groove provided in a stacking direction of the laminate on a side surface adjacent to the upper surface of the first conductor, and the at least one groove extends to the upper surface of the first conductor. When the second conductor is solder-bonded to the upper surface of the first conductor, the second conductor is disposed on the lower side of the laminate.

According to the second aspect, when the second conductor is solder-bonded to the upper surface of the first conductor in the laminate, the solder located between the first conductor and the second conductor directly contacts the end portion of the groove, and therefore, it is easy for excessive solder to be guided to the groove formed on the side surface of the first conductor. On the other hand, since the groove does not extend to the lower surface of the first conductor (a bonding surface between the first conductor and the semiconductor element), the solder guided in the groove does not reach the lower surface of the first conductor, and therefore, connection of the solder from the upper surface to the lower surface through the side surface of the first conductor is suppressed.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 8 illustrates a state in which a solder is connected over an entire side surface from an upper surface to a lower surface of the conductor spacer of the related art;

FIG. 10 illustrates a modification example in which a shape of a corner portion at which a groove is provided on the side surface of the conductor spacer is changed;

DETAILED DESCRIPTION OF EMBODIMENTS

A semiconductor device 10 and a method of manufacturing the semiconductor device 10 of an embodiment will be described with reference to the drawings. The semiconductor device 10 of the embodiment can be used for a power conversion circuit such as a converter or an inverter in an electrically driven vehicle such as an electric vehicle, a hybrid vehicle, and a fuel cell vehicle. Note that, a use of the semiconductor device 10 is not particularly limited. The semiconductor device 10 can be widely adopted for various devices or circuits.

Figure 1:
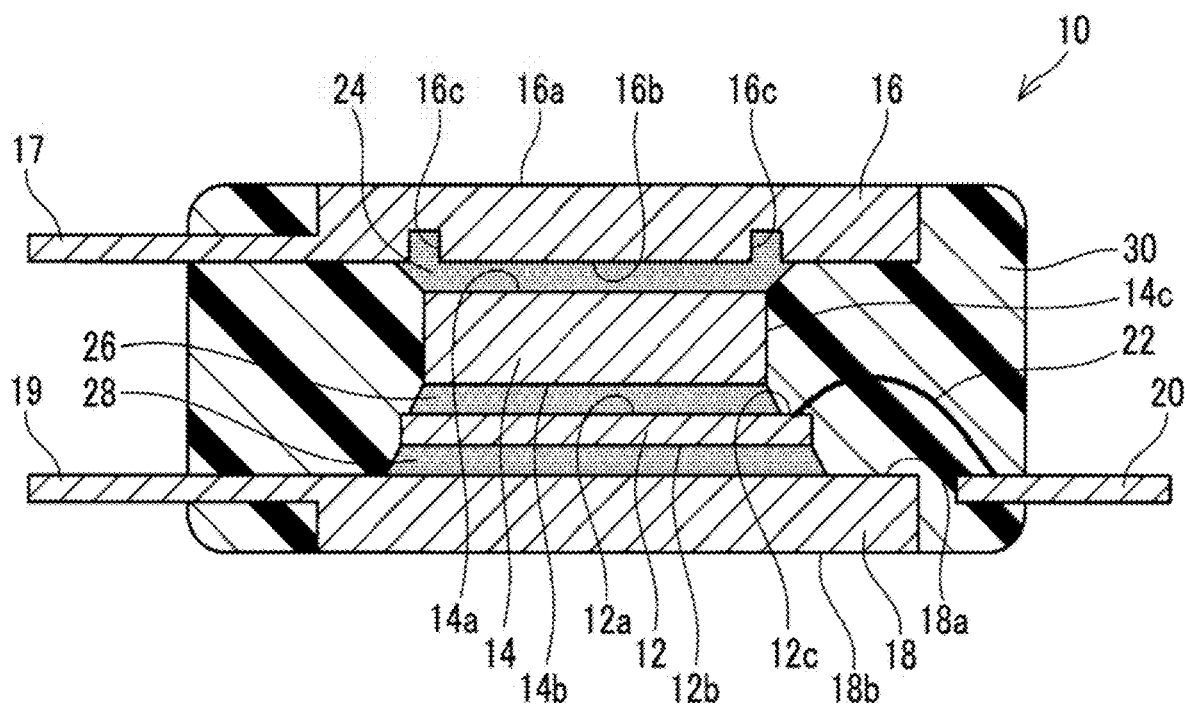
FIG. 1 is a cross-sectional view illustrating an internal structure of a semiconductor device of an embodiment.

As illustrated in FIG. 1, the semiconductor device 10 includes a semiconductor element 12, a sealing body 30, and a plurality of external connection terminals 17, 19, 20. The semiconductor element 12 is sealed inside the sealing body 30. The sealing body 30 is not particularly limited, but is formed of, for example, a thermosetting resin such as an epoxy resin. Each of the external connection terminals extends from the outside to the inside of the sealing body 30 and is electrically connected inside the sealing body 30. In one example, the external connection terminals 17, 19, 20 include power terminals 17, 19 and a signal terminal 20.

The semiconductor element 12 includes an upper surface electrode 12a, a lower surface electrode 12b, and a signal pad 12c. The upper surface electrode 12a and the signal pad 12c are located on an upper surface of the semiconductor element 12 and the lower surface electrode 12b is located on a lower surface of the semiconductor element 12. The semiconductor element 12 is a vertical semiconductor element having a pair of upper and lower electrodes 12a, 12b. The semiconductor element in this embodiment is a power semiconductor element such as a metal-oxide-semiconductor field-effect transistor (MOSFET) or an insulated gate bipolar transistor (IGBT). Further, the semiconductor element 12 can be formed of, for example, various semiconductor materials such as silicon (Si), silicon carbide (SiC), or gallium nitride (GaN). Materials constituting the upper surface electrode 12a, the lower surface electrode 12b, and the signal pad 12c are not particularly limited, and, for example, aluminum or other metals can be adopted.

The semiconductor device 10 includes a conductor spacer 14, an upper heat radiation plate 16, and a lower heat radiation plate 18. The conductor spacer 14 is formed of, for example, a material having conductivity such as copper or another metal. The conductor spacer 14 is generally a plate-shaped or block-shaped member and includes an upper surface 14a, a lower surface 14b located on the side opposite to the upper surface 14a, and four side surfaces 14c spreading between the upper surface 14a and the lower surface 14b. The conductor spacer 14 is located inside the sealing body 30. The upper surface 14a of the conductor spacer 14 is bonded to an upper heat radiation plate 16 to be described below via a solder layer 24. The lower surface 14b of the conductor spacer 14 is bonded to the upper surface electrode 12a of the semiconductor element 12 via a solder layer 26. That is, the conductor spacer 14 is electrically connected to the semiconductor element 12. The conductor spacer 14 secures a space when the signal terminal 20 is connected to the semiconductor element 12. Here, the conductor spacer 14 is an example of the first conductor. The solder layer 24 is an example of the second solder layer and the solder layer 26 is an example of the first solder layer.

The upper heat radiation plate 16 and the lower heat radiation plate 18 are formed of, for example, a material having excellent thermal conductivity such as copper, aluminum or other metal. The lower heat radiation plate 18 is generally a rectangular parallelepiped or plate-shaped member and includes an upper surface 18a and a lower surface 18b located opposite to the upper surface 18a. The upper surface 18a of the lower heat radiation plate 18 is bonded to the lower surface electrode 12b of the semiconductor element 12 via a solder layer 28. That is, the lower heat radiation plate 18 is electrically and thermally connected to the semiconductor element 12. Accordingly, the lower heat radiation plate 18 not only constitutes a portion of the electrical circuit of the semiconductor device 10 but also functions as a heat radiation plate that releases the heat of the semiconductor element 12 to the outside.

The upper heat radiation plate 16 is generally a rectangular parallelepiped or plate-shaped member and includes an upper surface 16a and a lower surface 16b located opposite to the upper surface 16a. The upper surface 16a of the upper heat radiation plate 16 is exposed to the outside of the sealing body 30. The lower surface 16b of the upper heat radiation plate 16 is bonded to the upper surface 14a of the conductor spacer 14 via the solder layer 24. That is, the upper heat radiation plate 16 is electrically and thermally connected to the semiconductor element 12 via the conductor spacer 14. Accordingly, the upper heat radiation plate 16 not only constitutes a portion of the electrical circuit of the semiconductor device 10, but also functions as a heat radiation plate that releases heat of the semiconductor element 12 to the outside. Thus, the semiconductor device 10 of the embodiment has a double-sided cooling structure in which the upper heat radiation plate 16 and the lower heat radiation plate 18 are exposed to both surfaces of the sealing body 30. Here, the upper heat radiation plate 16 is an example of the second conductor.

As described above, the semiconductor device 10 includes the power terminals 17, 19 and the signal terminal 20 as a plurality of external connection terminals. In an example, the power terminal 17 is bonded to the lower surface 16b of the upper heat radiation plate 16 and the power terminal 19 is bonded to the upper surface 18a of the lower heat radiation plate 18. For the bonding, a bonding method using welding or the like can be adopted. The bonding is not particularly limited, and other bonding scheme may be adopted. In addition, the signal terminal 20 is connected to the signal pad 12c of the semiconductor element 12 via a bonding wire 22.

A groove 16c is provided on the lower surface 16b of the upper heat radiation plate 16 to surround the solder layer 24. When the conductor spacer 14 and the upper heat radiation plate 16 are soldered, it is possible to suppress, by means of the groove 16c, accommodation of excessive solder and spreading of excessive solder in a wet manner to an unintended range.

However, when excessive solder cannot be sufficiently absorbed by the groove 16c of the upper heat radiation plate 16, the excessive solder may spread in a wet manner along the side surface 14c of the conductor spacer 14. When the solder is connected from the upper surface 14a to the lower surface 14b through the side surface 14c of the conductor spacer 14, it is easy for a large stress to act on the semiconductor element 12 from the solder at a portion at which the solder has been connected. As a result, reliability of the semiconductor device 10 is likely to be degraded.

Figure 2:
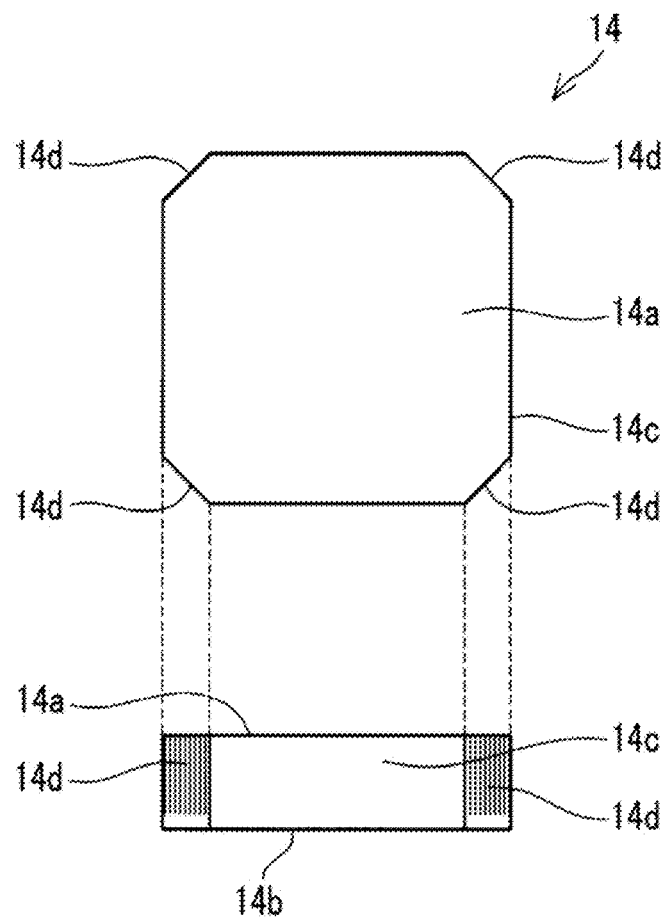
FIG. 2 is a plan view and a side view of a conductor spacer of a semiconductor device.
Figure 3:
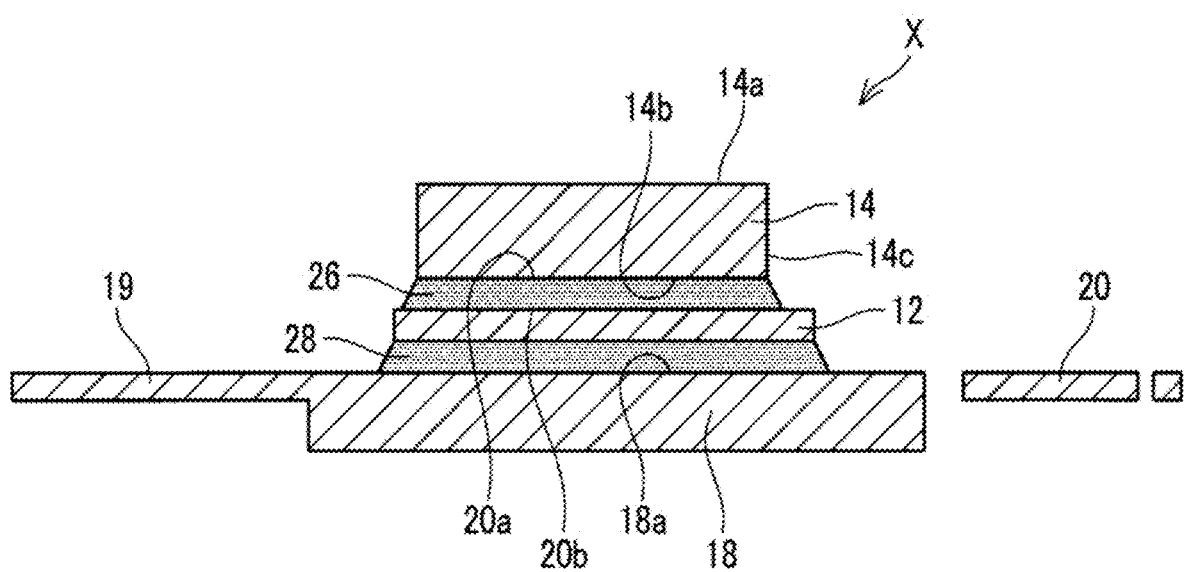
FIG. 3 illustrates a first reflow step of laminating a lower heat radiation plate, a semiconductor element, and a conductor spacer in this order and forming a laminate by soldering.

In the present disclosure, as illustrated in FIG. 2, a plurality of grooves 14d is provided on the side surfaces 14c of the conductor spacer 14. The grooves 14d extend in the stacking direction of the semiconductor device 10. With such a configuration, when the conductor spacer 14 and the upper heat radiation plate 16 are soldered or when the conductor spacer 14 and the semiconductor element 12 are soldered, excessive solder is guided to the grooves 14d formed on the side surfaces 14c of the conductor spacer 14. That is, a position at which the excessive solder spreads in a wet manner can be limited to a position at which the groove 14d is formed.

Accordingly, in the embodiment, the positions of the grooves 14d formed on the side surfaces 14c of the conductor spacer 14 are provided at four corner portions of the conductor spacer 14, which are ranges corresponding to the four corner portions of the semiconductor element 12, as illustrated in FIG. 2. With such a configuration, it is easy for excessive solder to be guided to ranges corresponding to corner portions of the semiconductor element 12. Here, the ranges corresponding to the corner portions of the semiconductor element 12 on the side surfaces 14c of the conductor spacer 14 means ranges including position closest to the corner portions of the semiconductor element 12, and corresponds to portions located at the four corner portions of the conductor spacer 14 in a plan view (see an upper portion of FIG. 2) in the conductor spacer 14 of the embodiment. The four corner portions of the conductor spacer 14 are chamfered, and the grooves 14d are provided on chamfered surfaces. At the corner portions of the semiconductor element 12, a stress acting from the solder to the semiconductor element 12 is inherently small. Therefore, even when the solder is connected from the upper surface 14a to the lower surface 14b through the side surface 14c of the conductor spacer 14, it is possible to avoid an excessive stress from acting on the semiconductor element 12 from the solder. Accordingly, it is possible to avoid or reduce degradation of reliability of the semiconductor device 10.

In addition, in an example, the groove 14d in the side surface 14c of the conductor spacer 14 extends to the upper surface 14a of the conductor spacer 14 and does not extend to the lower surface 14b of the conductor spacer 14. That is, an end portion of the groove 14d on the upper surface 14a side of the conductor spacer 14 is located on the upper surface 14a of the conductor spacer 14, and an end portion of the groove 14d on the lower surface 16b side of the conductor spacer 14 is separated from the lower surface 14b of the conductor spacer 14. In this case, on the upper surface 14a of the conductor spacer 14, the end portion of the groove 14d on the upper surface 14a side of the conductor spacer 14 directly contacts the solder 24, and therefore, it is easy for excessive solder to be guided to the groove 14d formed in the side surface 14c of the conductor spacer 14. On the other hand, since the end portion of the groove 14d on the side of the lower surface 14b of the conductor spacer 14 is separated from the lower surface 14b of the conductor spacer 14, and therefore, the solder spreading in a wet manner along the groove 14d reaching the lower surface 14b of the conductor spacer 14 is suppressed. Accordingly, connection of the solder 24 between the conductor spacer 14 and the upper heat radiation plate 16 along the side surface 14c of the conductor spacer 14 is suppressed. Note that, a direction in which the groove 14d extends is not limited to the upper surface 14a of the conductor spacer 14 and the groove 14d may extend to the lower surface 14b. In this case, connection of the solder 26 between the conductor spacer 14 and the semiconductor element 12 along the side surface 14c of the conductor spacer 14 is suppressed. Note that, in another embodiment, the groove 14d may extend from the upper surface 14a to the lower surface 14b of the conductor spacer 14.

Here, the solders 24, 26 constitute the above-described solder layers 24, 26, and therefore, description will be given using the same reference numerals. Similarly, solder 28 to be described below also constitutes the above-described solder layer 28, and therefore, description will be given using the same reference numerals.

A method of manufacturing the semiconductor device 10 of the embodiment will be described with reference to FIGS. 3 to 6. First, the lower heat radiation plate 18, the semiconductor element 12, and the conductor spacer 14 are prepared. Here, a lead frame formed integrally with the external connection terminals 19, 20, for example, can be adopted for the lower heat radiation plate 18. Then, the lower heat radiation plate 18, the semiconductor element 12, and the conductor spacer 14 are sequentially arranged, and the respective members are soldered therebetween to form a laminate X (a first reflow step). In this case, the solder layers 28, 26 are formed between the upper surface 18a of the lower heat radiation plate 18 and the lower surface electrode 12b of the semiconductor element 12 and between the upper surface electrode 12a of the semiconductor element 12 and the lower surface of the conductor spacer 14, respectively. A solder in a sheet shape can be adopted as an example of the solders 26, 28 disposed between the respective members.

Figure 4:
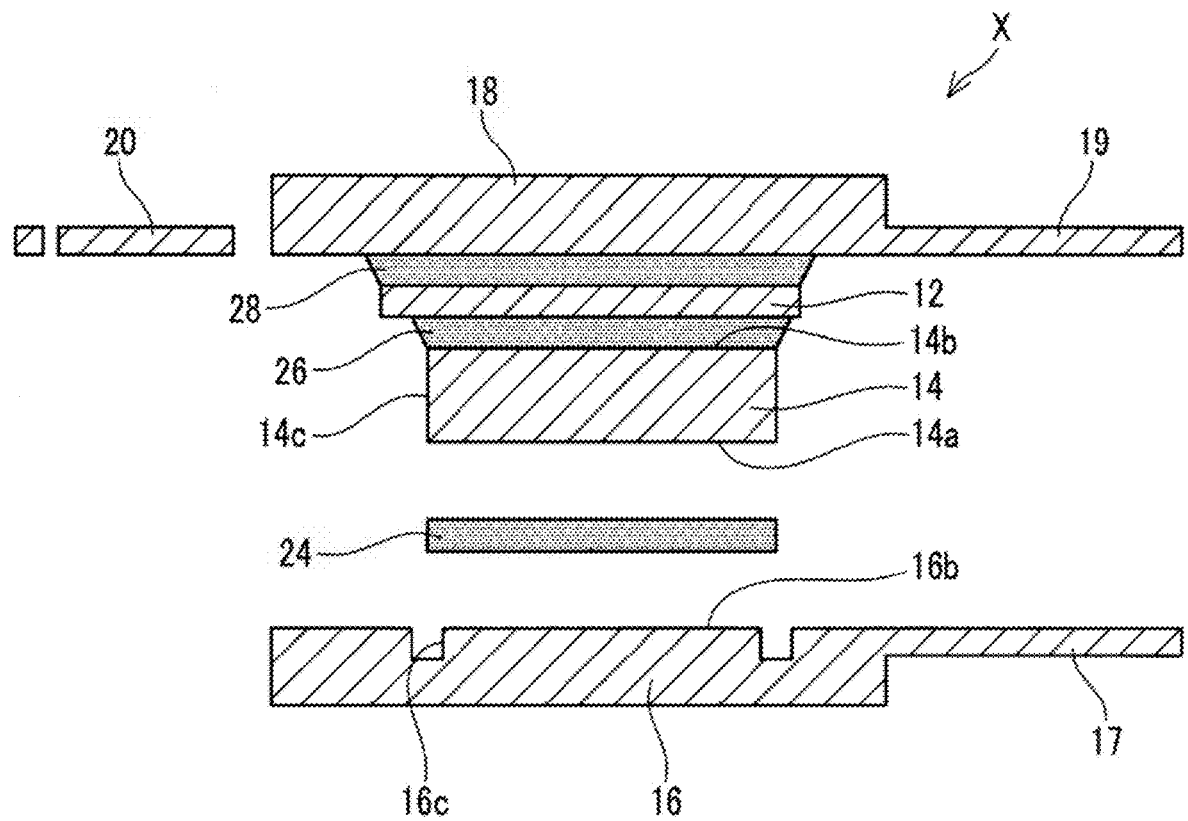
FIG. 4 illustrates a step of disposing the laminate on an upper heat radiation plate.
Figure 5:
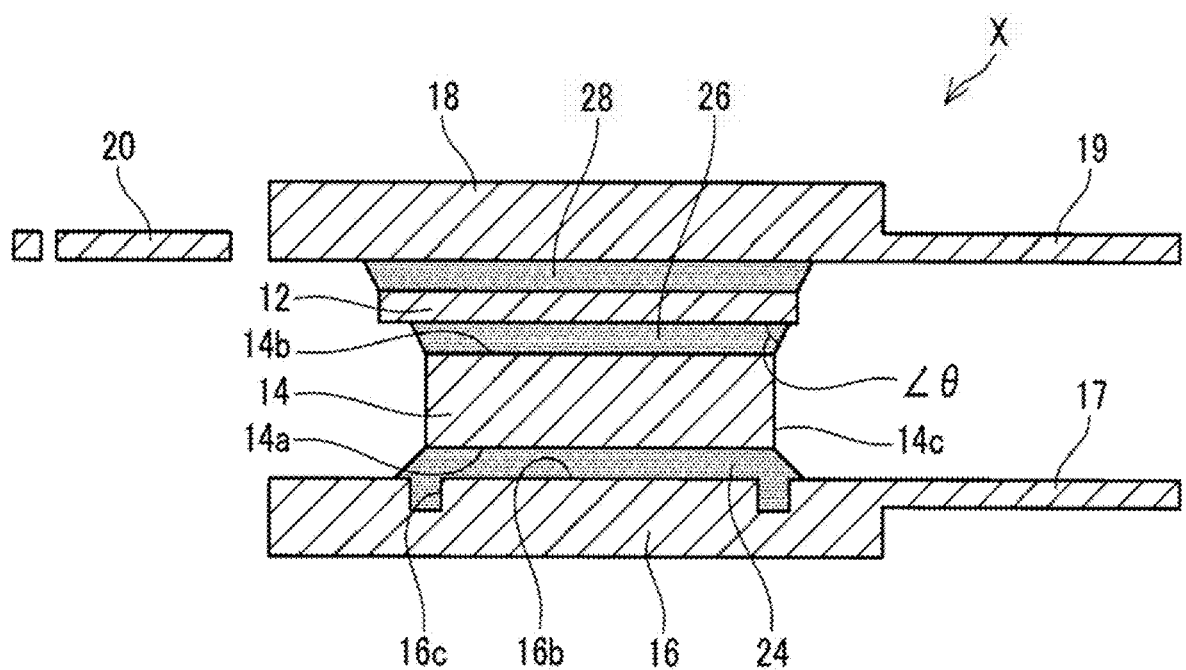
FIG. 5 illustrates a second reflow step of soldering the laminate onto the upper heat radiation plate.

Next, as illustrated in FIG. 4, the laminate X formed in the first reflow step is inverted on the lower surface 14b of the prepared upper heat radiation plate 16 and disposed so that the conductor spacer 14 becomes on the lower side. After the disposition, as illustrated in FIG. 5, the conductor spacer 14 and the upper heat radiation plate 16 are soldered (a second reflow step). In this case, the solder layer 24 is formed between the lower surface 16b of the upper heat radiation plate 16 and the upper surface 14a of the conductor spacer 14. For the solder 24 disposed between the upper heat radiation plate 16 and the conductor spacer 14, a sheet-shaped solder can be adopted, for example. Here, it has been found that an angle θ (see FIG. 5) formed by a fillet shape of the solder located between the conductor spacer 14 and the semiconductor element 12 after the second reflow step becomes equal to or greater than 90°, reliability of the semiconductor device is greatly degraded. Therefore, it is desirable for the angle θ formed by the fillet shape of the solder located between the conductor spacer 14 and the semiconductor element 12 to be smaller than 90°.

On the other hand, even when the angle θ formed by the fillet shape of the solder located between the conductor spacer 14 and the semiconductor element 12 is equal to or greater than 90°, a position at which excessive solder spreads in a wet manner is limited to a position at which the groove 14d has been formed due to the application of the present disclosure. Therefore, it is possible to suppress a large stress acting on the semiconductor element 12 from the solder.

Figure 6:
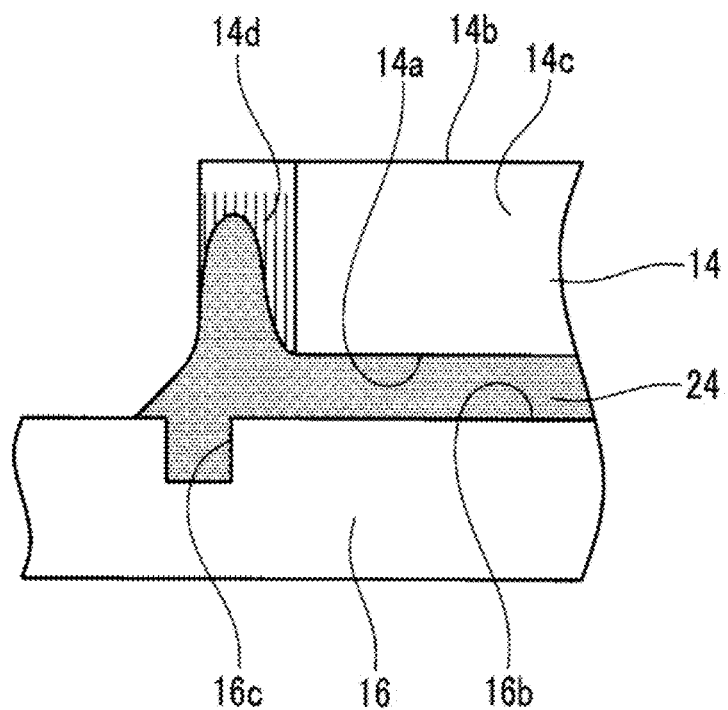
FIG. 6 schematically illustrates a behavior of a solder located between a conductor spacer and the upper heat radiation plate in the second reflow step.

In the embodiment, the grooves 14d of the conductor spacer 14 are located at the corner portions of the side surface 14c of the conductor spacer 14, as described above. Therefore, excessive solder of the solder 24 located between the conductor spacer 14 and the upper heat radiation plate 16 is preferentially guided to the range corresponding to the corner portions of the semiconductor element 12, as illustrated in FIG. 6. At the corner portions of the semiconductor element 12, a stress acting on the semiconductor element 12 from the solder is inherently small. Therefore, even when the solder is connected from the upper surface 14a to the lower surface 14b through the side surface 14c of the conductor spacer 14, an excessive stress acting on the semiconductor element 12 from the solder can be avoided since a range in which the excessive solder spreads in a wet manner is limited as described above.

In addition, since the grooves 14d of the conductor spacer 14 in the embodiment do not extend to the lower surface 14b of the conductor spacer 14 (a bonding surface between the conductor spacer 14 and the semiconductor element 12), the solder 24 guided to the grooves 14d does not reach the lower surface 14b of the conductor spacer 14. Accordingly, connection of the solders 24, 26 from the upper surface 14a to the lower surface 14b through the side surfaces 14c of the conductor spacer 14 is suppressed.

Figure 7:
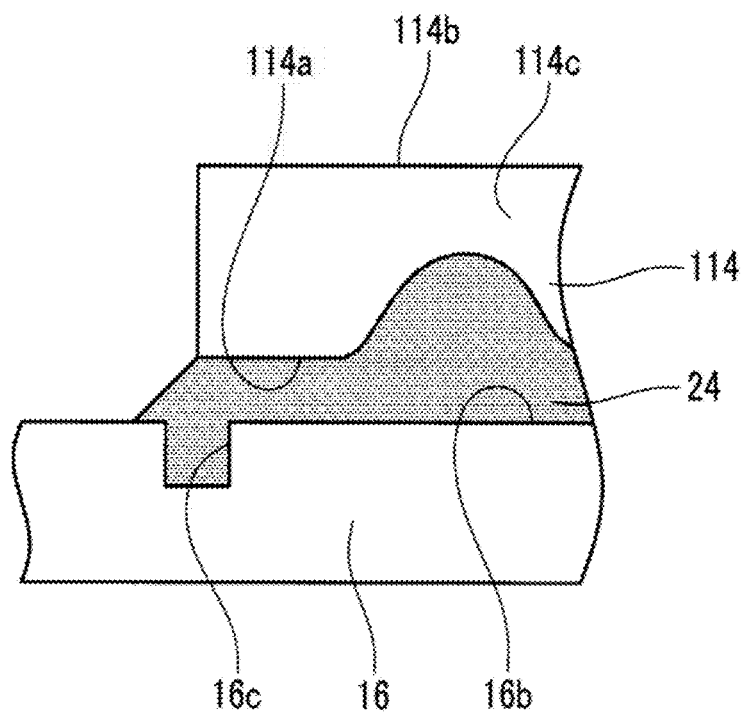
FIG. 7 schematically illustrates a behavior of a solder located between a conductor spacer and the upper heat radiation plate when a conductor spacer of the related art is used.

On the other hand, in a configuration of a semiconductor device of the related art, excessive solder of the solder 24 located between the conductor spacer 114 and the upper heat radiation plate 16 spreads in a wet manner over an entire side surface 114c of the conductor spacer 114, as illustrated in FIG. 7. When the solder 24 further spreads in a wet manner, the solder is likely to be connected over the entire side surface 114c from the upper surface 114a to the lower surface 114b of the conductor spacer 114 (see FIG. 8). As a result, an angle θ formed by a fillet shape of the solder located between the conductor spacer 114 and the semiconductor element 12 is equal to or greater than 90°, and reliability of the semiconductor device is greatly degraded. Note that, in this case, an angle at which the excessive solder of the solder 24 located between the conductor spacer 14 and the upper heat radiation plate 16 spreads in a wet manner and is connected is also included in the angle θ formed by the fillet shape of the solder located between the conductor spacer 114 and the semiconductor element 12.

After the second reflow step described above, the semiconductor element 12, the conductor spacer 14, the upper heat radiation plate 16, and the lower heat radiation plate 18 are sealed with the sealing body 30. Note that, for example, when the surfaces 16a and 18b of the heat radiation plates 16 and 18 are not exposed after sealing, the surface of the sealing body 30 is ground so that the surfaces 16a and 18b of the heat radiation plates 16 and 18 are exposed. Finally, for example, removal of unneeded portions (for example, a tie bar of the lead frame) is performed, and the electrical circuit is made independent so that the semiconductor device 10 is completed.

Figure 9A:
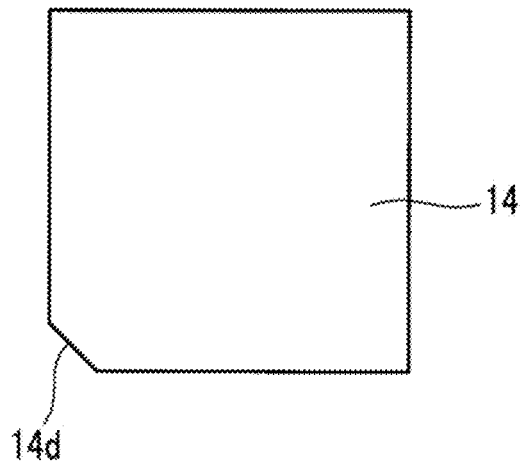
FIG. 9A illustrates a modification example in which a position (a corner portion) at which a groove is provided on a side surface of the conductor spacer is changed.
Figure 9B:
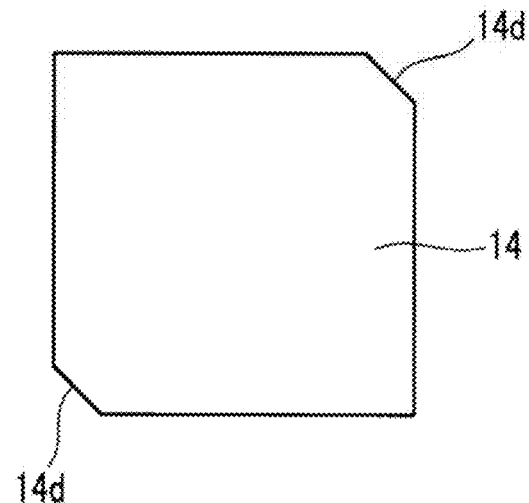
FIG. 9B illustrates a modification example in which a position (a corner portion) at which a groove is provided on a side surface of the conductor spacer is changed.
Figure 9C:
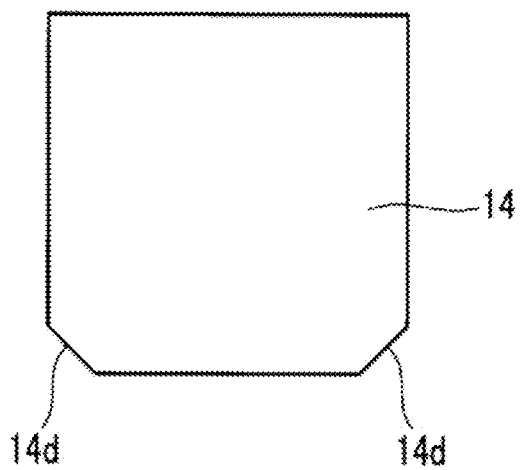
FIG. 9C illustrates a modification example in which a position (a corner portion) at which a groove is provided on a side surface of the conductor spacer is changed.
Figure 9D:
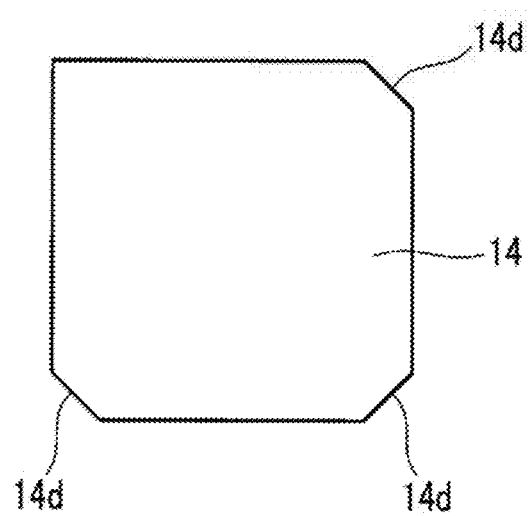
FIG. 9D illustrates a modification example in which a position (a corner portion) at which a groove is provided on a side surface of the conductor spacer is changed.

The position at which the groove 14d is provided at the corner portion of the side surface 14c of the conductor spacer 14 in the present disclosure can be variously changed. A modification example of the conductor spacer 14 will be described with reference to FIGS. 9A to 9D and FIG. 10. In the embodiment, the grooves 14d are provided at all the corner portions (that is, the four corner portions). Chamfering is performed by, for example, cutting or pressing, and the groove 14d is provided on the chamfered surface. The positions at which the groove 14d is provided is not limited to all the corner portions of the conductor spacer 14, and the groove 14d may be provided at one corner portion, two corner portions, or three corner portions. A specific example is shown below. The position at which the groove 14d is provided may be provided at one of the four corner portions, as illustrated in FIG. 9A. Further, the position at which the groove 14d is provided may be provided at two adjacent corner portions of the side surfaces 14c of the conductor spacer 14, as illustrated in FIG. 9B, or may be provided at two corner portions on a diagonal line, as illustrated in FIG. 9C. Further, the position at which the groove 14d is provided may be provided at three corner portions, as illustrated in FIG. 9D.

Further, the groove 14d on the side surface 14c of the conductor spacer 14 of the embodiment is chamfered by, for example, cutting or pressing at the four corner portions of the conductor spacer 14, and the groove 14d is provided on the chamfered surface. However, a shape of the surface on which the groove 14d is provided is not limited thereto. When the conductor spacer 14 is viewed in a plan view, for example, the corner portions are cut or pressed on the inner side of the conductor spacer so that the conductor spacer 14 is generally in a cross shape, and the groove 14d may be provided on the processed surface, as illustrated in FIG. 10.

Figure 11A:
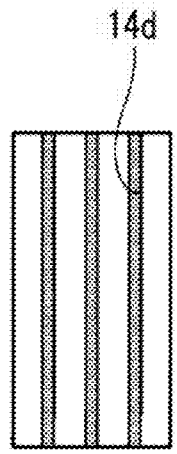
FIG. 11A illustrates a modification example in which a shape of a groove on the side surface of the conductor spacer is changed.
Figure 11B:
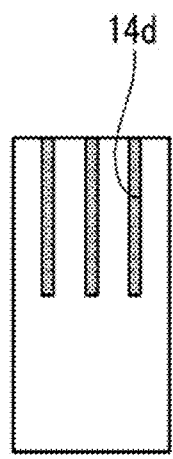
FIG. 11B illustrates a modification example in which a shape of a groove on the side surface of the conductor spacer is changed.
Figure 11C:
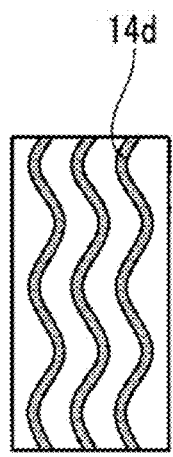
FIG. 11C illustrates a modification example in which a shape of a groove on the side surface of the conductor spacer is changed.

Similarly, the shape of the groove 14d on the side surface 14c of the conductor spacer 14 can be variously changed, as illustrated in FIGS. 11A to 11C. A modification example of the shape of the groove 14d of the side surface 14c of the conductor spacer 14 will be described below. As illustrated in FIG. 11A, the groove 14d may extend from the upper surface 14a (the upper heat radiation plate 16 side) to the lower surface 14b (the semiconductor element 12 side) of the conductor spacer 14. On the other hand, as illustrated in FIG. 11B, a length of the groove 14d may be relatively smaller than the length of the groove 14d of the embodiment, and the groove 14d extends to a length of the half ("half" includes "approximately half") the length from the upper surface 14a of the conductor spacer 14 to the lower surface 14b of the conductor spacer 14. In addition, the groove 14d is not limited to a linear shape and may have a wavy line shape as illustrated in FIG. 11C, or another linear shape.

Although several specific examples have been described in detail above, these are merely illustrative and do not limit the scope of the claims. Technologies described in the claims include those in which the specific examples above are variously modified and changed. Technical elements described in this specification or the drawings exhibit technical usefulness alone or in various combinations.

What is claimed is:

1. A semiconductor device comprising:
   a semiconductor element;
   a first conductor bonded to an upper surface of the semiconductor element via a first solder layer; and
   a second conductor bonded to an upper surface of the first conductor via a second solder layer,
   wherein the first conductor includes at least one groove provided in a stacking direction of the semiconductor element, the first conductor, and the second conductor on a side surface adjacent to the upper surface of the first conductor, and
   wherein the at least one groove of the first conductor extends to the upper surface of the first conductor and does not extend to a lower surface of the first conductor.

2. The semiconductor device according to claim 1, wherein the first conductor includes the at least one groove in a range corresponding to a corner portion of the semiconductor element on the side surface of the first conductor.

3. The semiconductor device according to claim 2, wherein the first conductor includes the at least one groove in at least one corner portion among four corner portions of the side surface.

4. The semiconductor device according to claim 3, wherein the corner portion is chamfered.

5. The semiconductor device according to claim 3, wherein the corner portion is cut or pressed to have a cross shape when the first conductor is viewed in a plan view.

6. The semiconductor device according to claim 1, wherein the first conductor includes a plurality of grooves.

7. The semiconductor device according to claim 1, wherein an angle formed by a fillet shape of a solder located between the first conductor and the semiconductor element is smaller than 90°.

8. A method of manufacturing a semiconductor device, the method comprising:
   solder-bonding a first conductor to an upper surface of a semiconductor element to form a laminate; and
   solder-bonding a second conductor to an upper surface of the first conductor in the laminate, wherein:
   the first conductor includes at least one groove provided in a stacking direction of the laminate on a side surface adjacent to the upper surface of the first conductor;
   the at least one groove extends to the upper surface of the first conductor and does not extend to a lower surface of the first conductor; and
   when the second conductor is solder-bonded to the upper surface of the first conductor, the second conductor is disposed on the lower side of the laminate.

* * * * *